United States Patent [19]
Giacomini

[11] Patent Number: 5,835,039
[45] Date of Patent: Nov. 10, 1998

[54] SELF-BIASING, LOW VOLTAGE, MULTIPLYING DAC

[75] Inventor: Joseph D. Giacomini, Eagan, Minn.

[73] Assignee: VTC Inc., Bloomington, Minn.

[21] Appl. No.: 873,275

[22] Filed: Jun. 11, 1997

Related U.S. Application Data

[60] Provisional application No. 60/019,721, Jun. 13, 1996.
[51] Int. Cl.$^6$ .................................................. H03M 1/66
[52] U.S. Cl. ........................... 341/135; 341/136; 341/144
[58] Field of Search .................................. 341/135, 144, 341/136

[56] References Cited

U.S. PATENT DOCUMENTS

| | | | |
|---|---|---|---|
| 4,563,670 | 1/1986 | Stallkamp et al. ........................ | 341/144 |
| 5,369,406 | 11/1994 | Hughes ..................................... | 341/135 |
| 5,739,780 | 4/1998 | Cheng et al. ............................. | 341/135 |

*Primary Examiner*—Howard L. Williams
*Attorney, Agent, or Firm*—Kinney & Lange, P.A.

[57] ABSTRACT

A multiplying digital-to-analog converter produces first and second output currents that have a magnitude difference equal to a gain value multiplied by a magnitude difference between first and second input currents. The multiplying digital-to-analog converter has first and second input nodes for carrying the first and second input currents and first and second output nodes for carrying the first and second output currents. A first input transistor has a first terminal coupled to the first input node, a second terminal with voltage that increases with increases in the first input current, and a third terminal for carrying a first input bias current. A second input transistor has a first terminal coupled to the second input node, a second terminal with a voltage that increases with increases in the second input current, and a third terminal for carrying a second input bias current. A first output transistor has a first terminal coupled to the first output node, a second terminal coupled to a second terminal of the first input transistor, and a third terminal for carrying a first output bias current. A similar second output transistor has a third terminal for carrying a second output bias current. A first output bias circuit between a reference voltage and the third terminals of the first and second output transistors includes a gate transistor receiving a gate input signal, wherein the gate transistor is the only element in the first output bias circuit that is capable of receiving a signal other than the first and second output bias currents and the reference voltage.

20 Claims, 3 Drawing Sheets

SELF-BIASING, LOW VOLTAGE, MULTIPLYING DAC

This application claims the priority benefits of a provisional U.S. patent application having application No. 60/019,721, filed Jun. 13, 1996.

BACKGROUND OF THE INVENTION

The present invention relates to multiplying digital-to-analog converters. In particular, the present invention relates to self-biasing, low voltage, multiplying digital-to-analog converters.

Multiplying digital-to-analog converters (multiplying DACs) produce two output currents that have a magnitude difference equal to a gain value multiplied by the magnitude difference between two input currents. The gain value is determined by a multi-bit binary input, which is capable of representing a range of binary values. In particular, the gain is equal to the ratio of a particular binary value to the total number of binary values that can be represented by the binary input. For instance, in a multiplying DAC with four binary input bits, there are $2^4$ or sixteen possible values that may be represented by the input bits. Therefore, a binary value of 0010, representing a decimal value of two, would create a gain of $2/16$ or $1/8$.

Some multiplying DACs apply negative gain values by accepting negative binary input values. A negative binary value is typically represented by a two's complement or a one's complement form of a positive value. A one's complement form of a positive binary value is produced by taking the complement of each bit in the binary value. The two's complement of a positive binary value is formed by adding 1 to the one's complement format. In both cases, the most significant bit, the bit furthest to the left, is equal to zero for a positive binary value and is equal to one for a negative binary value.

FIG. 1 shows a multiplying DAC 20 of the prior art. Multiplying DAC 20 receives two input current signals $I_1$ and $I_2$, and produces two output current signals $I_3$ and $I_4$. Transistors $Q_1$ and $Q_2$ form the input section of multiplying DAC 20, and receive input currents $I_1$ and $I_2$, respectively. Transistors $Q_1$ and $Q_2$ are both NPN bipolar transistors configured as diodes with their collectors connected to their bases. The emitters of transistors $Q_1$ and $Q_2$ are connected together at a reference voltage VREF. In this configuration, the emitter of transistor Q, carries a current that is nearly equal to the input current $I_1$. Similarly, transistor $Q_2$'s emitter carries a current that is nearly equal to input current $I_2$.

Each of the output currents, $I_3$ and $I_4$ are constructed from the sum of collector currents of NPN bipolar transistors. Specifically, output current $I_3$ is constructed from the sum of the collector currents of transistors $Q_3$ and $Q_6$; and output current $I_4$ is constructed from the sum of the collector currents of transistors $Q_4$ and $Q_5$. Transistors $Q_3$ and $Q_4$ are associated with a positive gain for the multiplying DAC and transistors $Q_5$ and $Q_6$ are associated with a negative gain.

The bases of transistors $Q_3$ and $Q_4$ are connected to the bases of transistors $Q_1$ and $Q_2$, respectively. The emitters of transistors $Q_3$ and $Q_4$ are connected together and are further connected to a tail current circuit. Thus, transistors $Q_3$ and $Q_4$ are configured as a differential pair. Because transistors $Q_3$ and $Q_4$ are connected as a differential pair between the bases of transistors $Q_1$ and $Q_2$, transistor $Q_3$ acts as a current mirror to transistor $Q_1$ and transistor $Q_4$ acts as a current mirror to transistor $Q_2$ such that the currents of transistors $Q_3$ and $Q_4$ are proportional to the currents of transistor $Q_1$ and $Q_2$, respectively. In addition, since all of the transistors $Q_1$, $Q_2$, $Q_3$, and $Q_4$ are identical, the ratio of transistor $Q_1$'s collector current over transistor $Q_3$'s collector current is the same as the ratio of transistor $Q_2$'s collector current over transistor $Q_4$'s collector current.

Transistors $Q_5$ and $Q_6$ are cross-connected relative to transistors $Q_3$ and $Q_4$. Thus, the base of transistor $Q_5$ is connected to the base of transistor $Q_1$ but the collector of transistor $Q_5$ is cross-connected to the node carrying output current $I_4$. Similarly, transistor $Q_6$ has its collector connected to the node carrying output current $I_3$ while its base is connected to the base of transistor $Q_2$. Transistors $Q_1$ and $Q_5$, and transistors $Q_2$ and $Q_6$ form two additional current mirrors that attempt to form collector currents in transistors $Q_5$ and $Q_6$ that are proportional to the collector currents of transistors $Q_1$ and $Q_2$, respectively. Again, since transistors $Q_1,Q_2,Q_5$, and $Q_6$ are identical, the ratio of transistor $Q_1$'s collector current over transistor $Q_5$'s collector current is the same as the ratio of transistor $Q_2$'s collector current over transistor $Q_6$'s collector current.

Thus, the various collector currents, $I_c$, are defined as:

$$I_{C3}=AI_1; \qquad \text{Eq. (1)}$$

$$I_{C4}=AI_2; \qquad \text{Eq. (2)}$$

$$I_{C5}=BI_1; \qquad \text{Eq. (3)}$$

$$I_{C6}=BI_2. \qquad \text{Eq. (4)}$$

Where $I_{C3}$, $I_{C4}$, $I_{C5}$, $I_{C6}$ are the collector currents of transistors $Q_3$, $Q_4$, $Q_5$, and $Q_6$, respectively, and where A is the ratio of transistor $Q_1$'s collector current over transistor $Q_3$'s collector current, which is the same as the ratio of transistor $Q_2$'s collector current over transistor $Q_4$'s collector current; and B is the ratio of transistor $Q_1$'s collector current over transistor $Q_5$'s collector current, which is the same as the ratio of transistor $Q_2$'s collector current over transistor $Q_6$'s collector current.

Thus, output currents $I_3$ and $I_4$ are defined as:

$$I_3=AI_1+BI_2 \qquad \text{Eq. (5)}$$

$$I_4=AI_2+BI_1 \qquad \text{Eq. (6)}$$

The values of A and B can be determined by combining the currents defined by these values. Thus:

$$AI_1 + AI_2 = I_{C3} + I_{C4} \qquad \text{Eq. (7)}$$

$$A = \frac{I_{C3} + I_{C4}}{I_1 + I_2} \qquad \text{Eq. (8)}$$

and:

$$BI_1 + BI_2 = I_{C5} + I_{C6} \qquad \text{Eq. (9)}$$

$$B = \frac{I_{C5} + I_{C6}}{I_1 + I_2} \qquad \text{Eq. (10)}$$

Since the emitter currents of transistors $Q_3$, $Q_4$, $Q_5$ and $Q_6$ are approximately equal to their respective collector currents, the emitter currents may be substituted in the equations above, providing:

$$A = \frac{I_{E3} + I_{E4}}{I_1 + I_2} \qquad \text{Eq. (11)}$$

$$B = \frac{I_{E5} + I_{E6}}{I_1 + I_2} \qquad \text{Eq. (12)}$$

Thus, the ratios, A and B, that determine the output currents are controlled by the sum of the emitter currents of transistors $Q_3$ and $Q_4$; and the sum of the emitter currents of transistors $Q_5$ and $Q_6$, respectively. These emitter currents are determined by two respective tail current circuits that are connected to the two transistor pairs.

The tail current circuit connected to the emitters of transistors $Q_3$ and $Q_4$ includes three parallel current sources that are each part of separate current mirrors. The first current source includes transistor $Q_7$, resistor $R_1$ and field-effect transistor $Q_8$; the second current source includes transistor $Q_9$, resistor $R_2$ and field-effect transistor $Q_{10}$; and the third current source includes transistor $Q_{11}$, resistor $R_3$ and field-effect transistor $Q_{12}$. The collectors of transistors $Q_7$, $Q_9$, and $Q_{11}$ are connected together at the emitters of transistors $Q_3$ and $Q_4$. In addition, the bases of transistors $Q_7$, $Q_9$, and $Q_{11}$ are connected together and are further connected to an additional current source that completes each of the three current mirrors.

The additional current source is formed by transistor $Q_{13}$, resistor $R_4$, and field-effect transistor $Q_{13}$, with the base of transistor $Q_{13}$ connected to the bases of transistors $Q_7$, $Q_9$, and $Q_{11}$. Connected between the collector and the base of transistor $Q_{13}$ is transistor $Q_{14}$, which has its base connected to the collector of transistor $Q_{13}$ and its emitter connected to the base of transistor $Q_{13}$. A reference current IREF, is input to the node between the base of transistor $Q_{14}$ and the collector of transistor $Q_{13}$. In this configuration, reference current IREF causes transistors $Q_{13}$ and $Q_{14}$ to operate such that the collector current of transistor $Q_{13}$ is nearly equal to IREF.

In order to maintain transistor $Q_{14}$ in an active state, a bias circuit, formed by transistor $Q_{15}$ and resistor $R_5$, is connected to the emitter of transistor $Q_{14}$. Transistor $Q_{15}$ is connected in a diode configuration with the collector and base of transistor $Q_{15}$ connected to the emitter of transistor $Q_{14}$. Resistor $R_5$ is connected to the emitter of transistor $Q_{15}$ and is chosen to be sufficiently large to minimize current loss while maintaining transistor $Q_{14}$ in an active state.

The tail current circuit connected to the emitters of transistors $Q_5$ and $Q_6$ includes a single current source constructed from NPN transistor $Q_{17}$, resistor $R_6$, and field-effect transistor $Q_{18}$. Transistor $Q_{17}$ has its collector connected to the emitters of transistors $Q_5$ and $Q_6$, and its base connected to the base of transistors $Q_{13}$ to form a current mirror with transistor $Q_{13}$.

The collector currents of transistor $Q_7$, $Q_9$, $Q_{11}$, and $Q_{17}$ are controlled by the state of field-effect transistors $Q_8$, $Q_{10}$, $Q_{12}$, and $Q_{18}$, respectively, and the collector current of transistor $Q_{13}$. When a field-effect transistor is active, its respective transistor, $Q_7$, $Q_9$, $Q_{11}$ or $Q_{17}$, conducts a collector current that is proportional to the collector current of transistor $Q_{13}$. When a field-effect transistor is inactive, its respective transistor does not have a collector current. For instance, when field-effect transistor $Q_8$ is active, the collector current of transistor $Q_7$ is proportional to the collector current of transistor $Q_{13}$. When field-effect transistor $Q_8$ is inactive, transistor $Q_7$ does not have a collector current.

Each of the transistors $Q_7$, $Q_9$, $Q_{11}$ and $Q_{17}$ conducts a collector current of different proportions to the collector current of transistor $Q_{13}$. This is accomplished by scaling the respective transistors $Q_7$, $Q_9$, $Q_{11}$ and $Q_{17}$ to transistor $Q_{13}$, scaling the respective resistors $R_1$, $R_2$, $R_3$ and $R_6$ to resistor $R_4$, and scaling field-effect transistors $Q_8$, $Q_{10}$, $Q_{12}$ and $Q_8$ to transistor $Q_6$. For example, transistor $Q_7$ is typically chosen to be much smaller than transistor $Q_{13}$, resistor $R_1$ is chosen to be sixteen times as large as resistor $R_4$, and the width-to-length ratio of transistor $Q_{16}$ is sixteen times the width-to-length ratio of transistor $Q_8$. In this configuration, transistor $Q_7$, resistor $R_1$, and transistor $Q_8$ will conduct a current that is $\frac{1}{16}$ the current found in transistor $Q_{13}$, resistor $R_4$, and transistor $Q_{16}$. Similarly, resistor $R_2$ is chosen to be 8 times as large as resistor $R_4$ so that resistor $R_2$ and transistors $Q_9$ and $Q_{10}$ conduct $\frac{1}{8}$ the current of resistor $R_4$ and transistors $Q_{13}$ and $Q_{16}$. Resistor $R_3$ is chosen to be 4 times as large as resistor $R_4$ so that resistor $R_3$ and transistors $Q_{11}$ and $Q_{12}$ conduct $\frac{1}{4}$ the current of transistor $Q_{13}$, and resistor $R_6$ is chosen to twice as large as resistor $R_4$ so that resistor $R_6$ and transistors $Q_{17}$ and $Q_{18}$ conduct $\frac{1}{2}$ the current of transistor $Q_{13}$. Note that in this configuration, the collector currents of transistors $Q_7$, $Q_9$, $Q_{11}$, and $Q_{17}$ differ from each other by a factor of two. Specifically, the collector current of transistor $Q_{17}$ is twice the collector current of transistor $Q_{11}$, four times the collector current of transistor $Q_9$, and eight times the collector current of transistor $Q_7$.

The fact that the collector currents of transistors $Q_7$, $Q_9$ and $Q_{11}$ differ by factors of two creates a relationship between the binary inputs at the gates of field-effect transistors $Q_8$, $Q_{10}$, and $Q_{12}$ and the sum of the collector currents of transistors $Q_7$, $Q_9$, and $Q_{11}$. Specifically, the sum of the collector currents is equal to the decimal equivalent of the binary value represented by the binary inputs divided by sixteen and multiplied by $I_{C13}$, the collector current of transistor $Q_{13}$. Thus, for binary inputs $D_2$, $D_1$, and $D_0$, which are the inputs to field-effect transistors $Q_8$, $Q_{10}$, and $Q_{12}$, respectively, the sum of the collector currents for transistors $Q_7$, $Q_9$, and $Q_{11}$ is equal to the decimal equivalent of $D_2$ $D_1$ $D_0$ multiplied by $I^{C13}/16$. For example, if $D_2$ $D_1$ $D_0$ has a value of 101; where "1" is a high voltage and "0" is a low voltage relative to $V_{NEG}$, the decimal equivalent of "101" is 5 and the sum of the collector currents is $(5/16)$ $I_{C13}$. This result is clear from FIG. 1 where high values for $D_2$ and $D_0$ cause field-effect transistors $Q_8$ and $Q_{12}$ to be active and to conduct currents of $\frac{1}{16}$ $I_{C13}$ and $\frac{1}{4}$ $I_{C13}$, respectively. The low value of $D_1$ keeps transistor $Q_{10}$ inactive so that no current is conducted through the transistor. Thus, the sum of the collector currents of transistors $Q_7$, $Q_9$, and $Q_{11}$, is $(\frac{1}{16}+0+\frac{1}{4})$ $I_{C13}$ or $5/16$ $I_{C13}$.

Since the sum of the collector currents of transistors $Q_7$, $Q_9$, and $Q_{11}$ is equal to the sum of the emitter currents of transistors $Q_3$ and $Q_4$, the relationship between the binary inputs and the sum of the collector currents may be substituted into equation 11 listed above. Thus, $$A = \frac{I_{E3} + I_{E4}}{I_1 + I_2} = \frac{I_{C7} + I_{C9} + I_{C11}}{I_1 + I_2} = \frac{I_{C13}\text{DECIMAL}[D_2D_1D_0]}{(I_1 + I_2)16} \qquad \text{Eq. (13)}$$

Similarly, binary input $D_3$ of field-effect transistor $Q_{18}$ is related to the collector current of transistor $Q_{17}$ such that the decimal equivalent of a binary value represented by $D_3000$ multiplied by $I_{C13}/16$ is equal to the collector current of transistor $Q_{17}$. Since the collector current of transistor $Q_{17}$ is equal to the sum of the emitter currents of transistors $Q_5$ and $Q_6$, the relationship between $D_3$ and the collector current of transistor $Q_{17}$ may be substituted into equation above. Thus, $$B = \frac{I_{E5} + I_{E6}}{I_1 + I_2} = \frac{I_{C17}}{I_1 + I_2} = \frac{I_{C13}\text{DECIMAL}[D_3000]}{(I_1 + I_2)16} \qquad \text{Eq. (14)}$$

As noted above, the gain, G, of a multiplying DAC is equal to the difference between the output currents over the difference between the input currents, or:

$$G = \frac{I_3 - I_4}{I_1 - I_2} \qquad \text{Eq. (15)}$$

Using equations 5 and 6 above, equation 15 becomes:

$$G = \frac{AI_1 + BI_2 - AI_2 - BI_1}{I_1 - I_2} = \frac{(A-B)(I_1 - I_2)}{I_1 - I_2} = A - B \qquad \text{Eq. (16)}$$

Thus, combining equations 13, 14 and 16, the gain of the multiplying DAC is defined as:

$$G = A - B = \frac{I_{C13}(\text{DECIMAL}[D_2 D_1 D_0] - \text{DECIMAL}[D_3 000])}{(I_1 + I_2)16} \qquad \text{Eq. (17)}$$

The value of "Decimal $[D_2 D_1 D_0]$ - Decimal $[D_3 000]$" is equal to "DECIMAL $[D_3 D_2 D_1 D_0]$" if $D_3 D_2 D_1 D_0$ represents negative binary values using a two's complement format where a value of "1" for $D_3$ represents a negative value and a value of "0" for $D_3$ represents a positive value. Thus equation 17 may be simplified to:

$$G = \frac{I_{C13}\text{DECIMAL}[D_3 D_2 D_1 D_0]}{(I_1 + I_2)16} \qquad \text{Eq. (18)}$$

For a four-bit binary input, this multiplying DAC should have gain values between $-8/16$ and $+7/16$. In order for that to be true in equation 18, $I_{C13}$ must equal $I_1 + I_2$.

$I_{C13}$ equals $I_1 + I_2$ when IREF is equal to $I_1 + I_2$. Therefore, in the prior art, reference current IREF must be adjusted to match the common mode of input currents $I_1$ and $I_2$. However, this is difficult to accomplish because of noise in the common mode of input currents $I_1$ and $I_2$ and noise introduced into the reference current between the point where the reference current is generated and where it is received by transistor $Q_{13}$. Since changes in the reference current relative to $(I_1 + I_2)$ cause unwanted changes in the gain of the multiplying DAC, the use of a reference current in the prior art is undesirable.

It should also be noted that the reference voltage, $V_{REF}$, connected to the emitters of transistors $Q_1$ and $Q_2$, must be maintained above the voltage at the bases of transistors $Q_7$, $Q_9$, and $Q_{11}$, in order to keep those transistors from saturating. Thus, in the circuit of the prior art, the reference voltage and reference current both require specific and steady values that must be externally maintained to keep the circuit accurate.

In addition, for both positive and negative gains, the circuit of FIG. 1 requires a minimum of 2 volts of headroom and in practice 2.5 volts is required to achieve fast settling times. The headroom is measured between the nodes carrying the output currents and the negative power supply voltage $V_{NEG}$. The 2 volt minimum is largely caused by the fact that there are at least two diode drops between the output node and the negative power supply voltage. For instance, transistor $Q_3$ introduces one diode voltage drop from its base to its emitter and transistor $Q_7$ introduces a second voltage drop from its base to its emitter. This required headroom is undesirable in light of continuing efforts to reduce the power supply voltages used in electronics.

SUMMARY OF THE INVENTION

The present invention is a self-biasing, multiplying digital-to-analog converter for producing first and second output currents that have a magnitude difference equal to a gain value multiplied by a magnitude difference between first and second input currents. The first and second input currents are carried on first and second input nodes, respectively; and the first and second output currents are carried on first and second output nodes, respectively. First and second input transistor have respective first terminals coupled to the first and second input nodes, respectively. Additionally, the first and second input transistors have respective second terminals that have voltages that increase with increases in the respective first and second input currents. First and second output transistor have respective first terminals coupled to the first output node and second output node, respectively; second terminals coupled to the respective second terminals of the first input transistor and second input transistor; and third terminals for carrying a first output bias current and a second output bias current respectively. The third terminals of the first and second output transistors are connected to an output bias circuit that is further connected to a reference voltage. The first output bias circuit includes a gate transistor that receives a gate input signal. The gate transistor is the only element in the first output bias circuit that receives a signal other than the first and second output bias currents and the reference voltage.

Additional embodiments of the present invention include an input bias circuit connected to the third terminals of the first and second input transistors. The input bias circuit having an impedance greater than zero and in preferred embodiments having an impedance that is a fraction of the impedance found in the first output bias circuit. This fractional impedance causing the sum of the currents in the third terminals of the first and second output transistors to be a fraction of the current in the third terminals of the first and second input transistors.

In additional embodiments of the present invention, additional pairs of output transistors are added to the circuit. The two additional transistors in each pair having respective first terminals connected respectively to the first and second output nodes and respective second terminals respectively connected to the respective second terminals of the first and second input transistors. The two transistors in each additional pair having respective third terminals connected together and connected to an additional respective output bias circuit. The additional respective output bias circuit having a respective gate used to control the conduction of current through the output bias circuit. The respective gate being the only element in the output bias circuit receiving a signal other than the current signal passing through the third terminals of the additional pair of transistors and the reference voltage.

In still further embodiments of the present invention, the gate is shifted from the output bias circuit but remains connected to the third terminals of the first and second output transistors. In these embodiments, the gate is further connected to a voltage source that is capable of providing a voltage to the third terminals of the first and second output transistors when the gate is active. This voltage is sufficient to turn off the first and second output transistors so that their contributions to the first and second output currents is zero. In embodiments with multiple pairs of output transistors, there are multiple gates with connections to the same reference voltage.

By combining the tail current production and the mirror functions of the prior art in one pair of output transistors, the present invention eliminates the need for a separate reference current. In addition, by including an impedance in the first input bias circuit, the circuit is self-biasing such that fluctuations in the common mode of the input currents are automatically compensated for by the input and output bias circuits. The present invention thereby eliminates the need for a reference current and a reference voltage and reduces the headroom multiplying DAC.

DETAILED DESCRIPTION OF THE PREFERRED EMBODIMENTS

Figure 1:
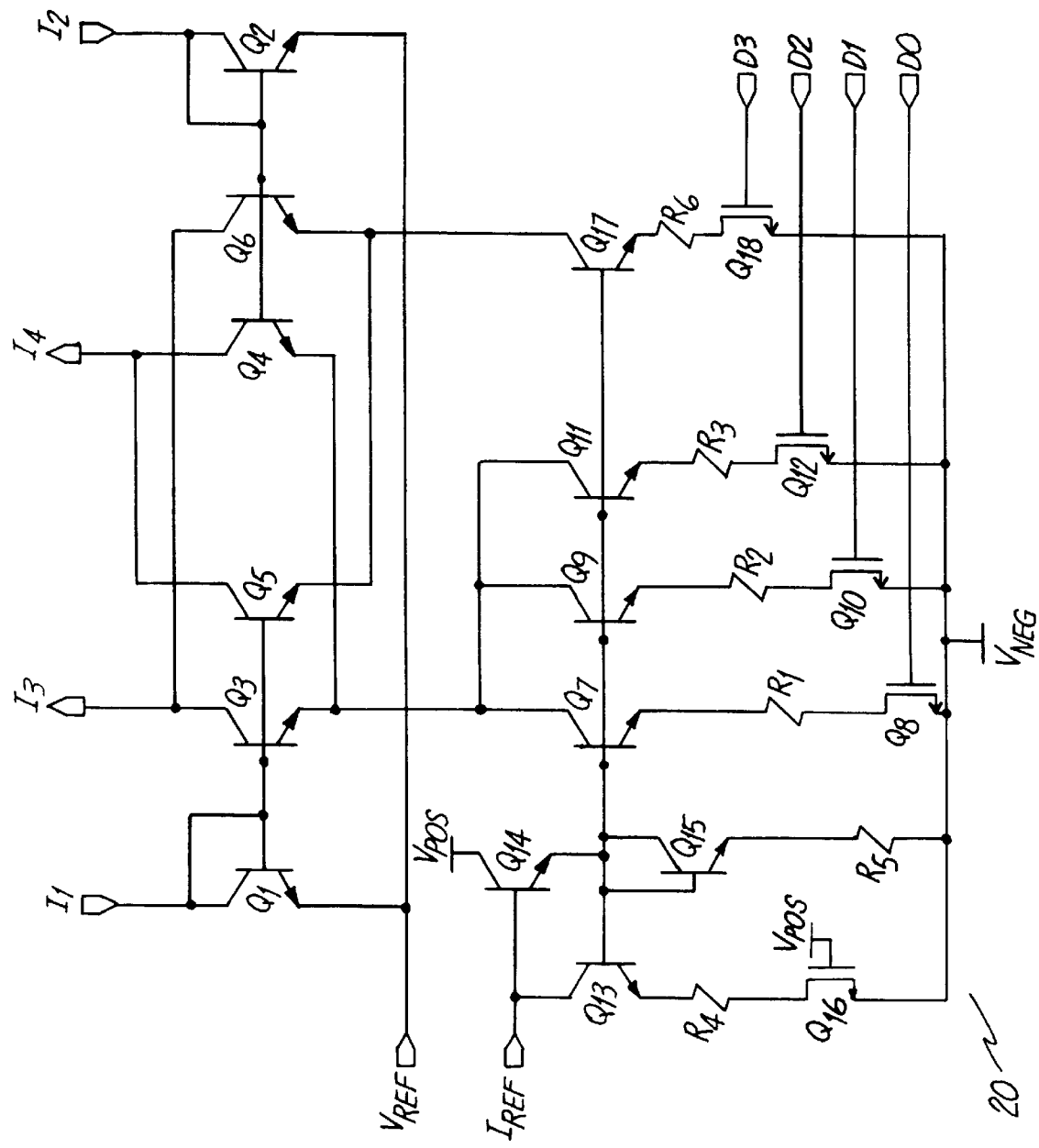
FIG. 1 is a prior art multiplying digital-to-analog converter.
Figure 2:
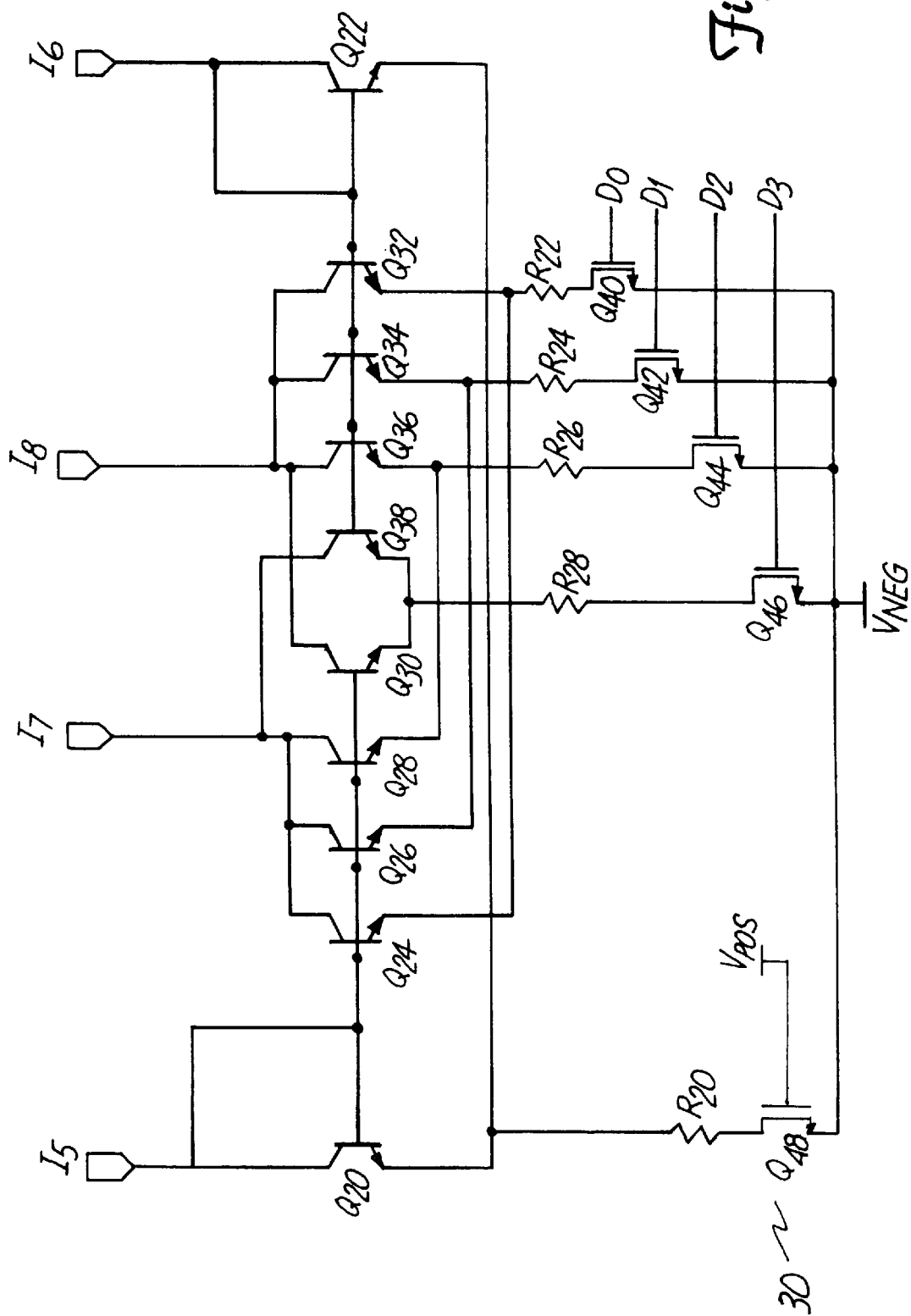
FIG. 2 is a multiplying digital-to-analog converter of the present invention.

FIG. 2 is a circuit diagram of a multiplying digital-to-analog converter (DAC) 30 of the present invention. Multiplying DAC 30 receives two input currents, $I_5$ and $I_6$, and produces two output currents, $I_7$ and $I_8$. The majority of input current $I_5$ is received by the collector of input transistor $Q_{20}$, which is configured as a diode with its base connected to its collector. The majority of input current $I_6$ passes through the collector of transistor $Q_{22}$, which is also configured as a diode with its base connected to its collector. The emitters of transistors $Q_{20}$ and $Q_{22}$ are connected together and to an input bias resistor $R_{20}$. The second terminal of resistor $R_{20}$ is connected to the drain of field-effect transistor $Q_{16}$, which has its gate connected to $V_{POS}$ and its source connected to reference voltage $V_{NEG}$. Input bias resistor $R_{20}$ and transistor $Q_{16}$ form an input bias circuit between the emitters of transistors $Q_{20}$ and $Q_{22}$ and reference voltage $V_{NEG}$.

Each input transistor $Q_{20}$ and $Q_{22}$ forms four separate current mirrors with four output transistors. Specifically, output transistors $Q_{24}$, $Q_{26}$, $Q_{28}$, and $Q_{30}$ form current mirrors with input transistor $Q_{20}$, and output transistors $Q_{32}$, $Q_{34}$, $Q_{36}$, and $Q_{38}$ form current mirrors with input transistor $Q_{22}$. Output transistors $Q_{24}$, $Q_{26}$, and $Q_{28}$ have their bases connected to the base of transistor $Q_{20}$ and their collectors connected together at an output node carrying output current $I_7$. Output transistors $Q_{32}$, $Q_{34}$, and $Q_{36}$ have their bases connected to the base of input transistor $Q_{22}$ and their collectors connected together at a node carrying output current $I_8$. Transistor $Q_{30}$, which forms a current mirror with transistor $Q_{20}$, has its base connected to the base of transistor $Q_{20}$, but has its collector connected to the output node carrying output current $I_8$. Similarly, output transistor $Q_{38}$ has its base connected to the base of $Q_{22}$, but its collector connected to the output node carrying output current $I_7$. As described below, these cross-connections of transistors $Q_{30}$ and $Q_{38}$ permit multiplying DAC 30 to implement negative gains.

In addition to forming current mirrors with the input transistors, each output transistor is part of a differential pair of transistors that share a common output bias circuit. For example, output transistors $Q_{24}$ and $Q_{32}$ form a differential pair, and have their emitters connected together at a first output bias circuit. The first output bias circuit includes resistor $R_{22}$ which is connected between the emitters of transistors $Q_{24}$ and $Q_{32}$ and a field effect transistor $Q_{40}$, which has its drain connected to the second end of resistor $R_{22}$ and its source connected to reference voltage $V_{NEG}$. A digital input, $D_0$, is received at the gate of transistor $Q_{40}$ and controls the activation of transistor $Q_{40}$. When input $D_0$ is equal to reference voltage $V_{NEG}$, transistor $Q_{40}$ is off and current does not flow through the emitters of transistors $Q_{24}$ and $Q_{32}$. When input $D_0$ is high relative to $V_{NEG}$, transistor $Q_{40}$ is active and a current flows through both transistor $Q_{24}$ and transistor $Q_{32}$.

Transistors $Q_{26}$ and $Q_{34}$ form a second differential pair with their emitters connected together at a second output bias circuit that includes resistor $R_{24}$ and field-effect transistor $Q_{42}$. Specifically, the emitters of transistors $Q_{26}$ and $Q_{24}$ are connected to one terminal of resistor $R_{24}$. The second terminal of resistor $R_{24}$ is connected to the drain of field-effect transistor $Q_{42}$, which has its source connected to reference voltage $V_{NEG}$. The gate of field-effect transistor $Q_{42}$ receives digital input $D_1$ and when $D_1$ is equal to $V_{NEG}$, the emitter currents of transistors $Q_{26}$ and $Q_{34}$ are equal to zero. When $D_1$ is high relative to $V_{NEG}$, transistors $Q_{26}$ and $Q_{34}$ are active and conduct a current that passes through resistor $R_{24}$.

Similarly, transistors $Q_{28}$ and $Q_{36}$ form a third output differential pair and transistors $Q_{30}$ and $Q_{38}$ form a fourth differential pair. The emitters of transistors $Q_{28}$ and $Q_{36}$ are connected to a third output bias circuit that includes resistor $R_{26}$ and field-effect transistor $Q_{44}$. Resistor $R_{26}$ has one end connected to the emitters of transistors $Q_{28}$ and $Q_{36}$ and a second end connected to the drain of field-effect transistor $Q_{44}$, which has its source connected to reference voltage $V_{NEG}$. The gate of field-effect transistor $Q_{44}$ receives digital input $D_2$, which controls the activation of transistor $Q_{44}$. The emitters of transistors $Q_{30}$ and $Q_{38}$ are connected to a fourth output bias circuit that includes resistor $R_{28}$ and field-effect transistor $Q_{46}$. Resistor $R_{28}$ is connected to the emitters of transistors $Q_{30}$ and $Q_{38}$ and is further connected to the drain of field-effect transistor $Q_{46}$. The gate of field-effect transistor $Q_{46}$ receives digital input $D_3$, which controls the activation of field-effect transistor $Q_{46}$. The source of field-effect transistor $Q_{46}$ is connected to reference voltage $V_{NEG}$.

Digital inputs $D_0$, $D_1$, $D_2$ and $D_3$ control output currents $I_7$ and $I_8$ by controlling the currents in the differential pairs of transistors. As described above, when a particular digital input is low relative to $V_{NEG}$, its respective field-effect transistor and differential pair of transistors are inactive. When a particular digital input is high, the respective field-effect transistor conducts a current that is determined by the ratio of the respective resistor in the respective output bias circuit to the resistor in the input bias circuit. For instance, when $D_0$ is high relative to $V_{NEG}$ and $Q_{40}$ conducts a current, it is the ratio of resistor $R_{22}$ to resistor $R_{20}$ that determines the percentage of input current $I_6$ and input current $I_5$ that appears in the collector currents of transistors $Q_{32}$ and $Q_{24}$, respectively.

Specifically, when $D_0$ is high, the collector current of transistor $Q_{24}$ is approximately equal to the ratio $R_{20}/R_{22}$, times $I_5$ and the collector current of transistor $Q_{32}$ is approximately equal to the ratio $R_{20}/R_{22}$ times $I_6$. Similarly, when $D_1$ is high, the collector currents of transistors $Q_{26}$ and $Q_{34}$ are approximately equal to $R_{20}/R_{24}$ times $I_5$ and $I_6$, respectively; when $D_2$ is high, the collector currents of transistors $Q_{28}$ and $Q_{36}$ are approximately equal to $R_{20}/R_{26}$ times $I_5$ and $I_6$, respectively; and when $D_3$ is high, the collector currents of transistors $Q_{30}$ and $Q_{38}$ are approximately equal to $R_{20}/R_{28}$ times $I_5$ and $I_6$, respectively. In terms of equations, using a value of "1" for high and "0" for low:

$$I_{C24} = \frac{R_{20}}{R_{22}} I_5 D_0 \qquad \text{Eq. (19)}$$

$$I_{C26} = \frac{R_{20}}{R_{24}} I_5 D_1 \qquad \text{Eq. (20)}$$

$$I_{C28} = \frac{R_{20}}{R_{26}} I_5 D_2 \qquad \text{Eq. (21)}$$

$$I_{C30} = \frac{R_{20}}{R_{28}} I_5 D_3 \qquad \text{Eq. (22)}$$

-continued $$I_{C32} = \frac{R_{20}}{R_{22}} I_6 D_0 \quad \text{Eq. (23)}$$

$$I_{C34} = \frac{R_{20}}{R_{24}} I_6 D_1 \quad \text{Eq. (24)}$$

$$I_{C36} = \frac{R_{20}}{R_{26}} I_6 D_2 \quad \text{Eq. (25)}$$

$$I_{C38} = \frac{R_{20}}{R_{28}} I_6 D_3 \quad \text{Eq. (26)}$$

where $I_{C24}$, $I_{C26}$, $I_{C28}$, $I_{C30}$, $I_{C32}$, $I_{C34}$, $I_{C36}$, and $I_{C38}$ are the collector currents of transistors $Q_{24}$, $Q_{26}$, $Q_{28}$, $Q_{30}$, $Q_{32}$, $Q_{34}$, $Q_{36}$, and $Q_{38}$.

Each of these approximations can be improved by scaling the output transistors relative to the input transistors such that the respective output transistor has a saturation current that is equal to the saturation current of the input transistor times the ratio of the input resistor over the respective output resistor. The saturation current, $I_S$, of a transistor is found in the basic transistor equation:

$$I_C = I_S e^{\frac{V_{BE}}{V_T}} \quad \text{Eq. (27)}$$

which is well known to those skilled in the art. The approximation is further improved by scaling gate transistors $Q_{40}$, $Q_{42}$, $Q_{44}$ and $Q_{46}$ to transistor $Q_{48}$ such that the ratio of the resistance of transistor $Q_{48}$, when it is on, to the resistance of a respective one of the gate transistors, when the respective gate transistor is on, is equal to the ratio of resistor R20 to the respective resistor connected to the respective transistor. For example, $r_{ON-Q48}/r_{ON-Q40}$ is equal to R20/R22, where $r_{ON-Q48}$ is the "on" resistance of transistor $Q_{48}$ and $r_{ON-Q40}$ is the "on" resistance of transistor $Q_{40}$.

Preferably, resistors $R_{28}$, $R_{26}$, $R_{24}$ are chosen to be, respectively, two times, four times, eight times, and sixteen times as large as resistor $R_{20}$. With these resistor values, equations 19 through 25 become:

$$I_{C24} = \frac{1}{16} I_5 D_0 \quad \text{Eq. (28)}$$

$$I_{C26} = \frac{1}{8} I_5 D_1 \quad \text{Eq. (29)}$$

$$I_{C28} = \frac{1}{4} I_5 D_2 \quad \text{Eq. (30)}$$

$$I_{C30} = \frac{1}{2} I_5 D_3 \quad \text{Eq. (31)}$$

$$I_{C32} = \frac{1}{16} I_6 D_0 \quad \text{Eq. (32)}$$

$$I_{C34} = \frac{1}{8} I_6 D_1 \quad \text{Eq. (33)}$$

$$I_{C36} = \frac{1}{4} I_6 D_2 \quad \text{Eq. (34)}$$

$$I_{C38} = \frac{1}{2} I_6 D_3 \quad \text{Eq. (35)}$$

Since the collectors of transistors $Q_{24}$, $Q_{26}$, $Q_{28}$, and $Q_{38}$ are together at the node carrying output current $I_7$ and the collectors of transistors $Q_{32}$, $Q_{34}$, $Q_{36}$, and $Q_{30}$ are connected together at the node carrying output current $I_8$, output currents $I_7$ and $I_8$ are defined as:

$$I_7 = I_{C24} + I_{C26} + I_{C28} + I_{C38} \quad \text{Eq. (36)}$$

$$I_8 = I_{C32} + I_{C34} + I_{C36} + I_{C30} \quad \text{Eq. (37)}$$

Thus, the difference between output currents $I_7$ and $I_8$ is:

$$I_7 - I_8 = \frac{1}{16} D_0(I_5 - I_6) + \frac{1}{8} D_1(I_5 - I_6) + \quad \text{Eq. (38)}$$

$$\frac{1}{4} D_2(I_5 - I_6) + \frac{1}{2} D_3(I_6 - I_5)$$

or:

$$I_7 - I_8 = (I_5 - I_6) \left( \frac{1}{16} D_0 + \frac{1}{8} D_1 + \frac{1}{4} D_2 - \frac{1}{2} D_3 \right) \quad \text{Eq. (39)}$$

Therefore, the gain of multiplying DAC 30 is:

$$G = \frac{(I_7 - I_8)}{(I_5 - I_6)} = \left( \frac{1}{16} D_0 + \frac{1}{8} D_1 + \frac{1}{4} D_2 - \frac{1}{2} D_3 \right) \quad \text{Eq. (40)}$$

From equation 40, it is clear that binary inputs $D_0$, $D_1$, $D_2$, and $D_3$ can create a range of discrete gains from $-8/16$ to $7/16$, where each gain is separated by $1/16$. In fact, assigning bits of a binary value to the binary inputs, with "0" represented by a voltage of $V_{NEG}$ and "1" represented by a voltage greater than $V_{NEG}$, the decimal equivalent of the binary value is directly translated into the numerator of the gain for the multiplying DAC.

For example, if a binary value is assigned to the binary inputs such that the order of assignment is $D_3$ $D_2$ $D_1$ $D_0$, from most significant to least significant bit, then a binary value of 0101, which is equal to +5 decimal, will be directly translated into the numerator of the gain by creating a gain of $5/16$ for multiplying DAC 30. Specifically, the binary value of 0101 causes $D_3$ and $D_1$ to have a voltage of $V_{NEG}$ and causes $D_2$ and $D_0$ to have a high voltage relative to $V_{NEG}$. This activates field-effect transistors $Q_{44}$ and $Q_{40}$ and de-activates field-effect transistors $Q_{42}$ and $Q_{46}$. Thus, the differential pair formed by transistors $Q_{24}$ and $Q_{32}$, which contribute a gain of $1/16$, and the differential pair formed by transistors $Q_{28}$ and $Q_{36}$, which contribute a gain of $4/16$ are both active to produce an overall gain of $5/16$. Thus, the numerator of the overall gain, 5, is equal to the decimal equivalent of the binary value 0101.

In this format, $D_3$ will be equal to $V_{NEG}$ for positive numbers and will be high relative to the $V_{NEG}$ for negative numbers. When $D_3$ is high relative to $V_{NEG}$, transistor $Q_{46}$ conducts a current and transistors $Q_{30}$ and $Q_{38}$ conduct collector currents that represent a gain of $-½$. Thus, a negative binary value represented in two's complement format will translate into a negative gain. For instance, the binary value 1011, representing decimal $-5$ creates an overall gain of $-5/16$. Specifically, the binary values 1011 creates gains of $-½$ from transistors $Q_{30}$ and $Q_{38}$, $⅛$ from transistors $Q_{26}$ and $Q_{34}$, and 1/16 from transistors $Q_{24}$ and $Q_{32}$, to form a sum of $(-8/16+2/16+1/16)$ or $-5/16$.

The embodiment of the present invention shown in FIG. 2 does not require a reference current or a reference voltage as found in the prior art. Instead, the embodiment of FIG. 2 develops a reference voltage for the output differential pairs using resistor $R_{20}$ and associated transistor $Q_{48}$ in the input bias circuit. Since the voltage developed across resistor $R_{20}$ and transistor $Q_{48}$ is dependent upon the common mode current of input currents $I_5$ and $I_6$, the output differential pairs are self-biased.

Compared to the prior art, the embodiment of FIG. 2 also has one less transistor between the output current nodes and $V_{NEG}$. This results in a lower headroom voltage for the embodiment of FIG. 2, since there is only one base-emitter voltage drop in FIG. 2, where there had been two base-emitter voltage drops in the prior art.

Figure 3:
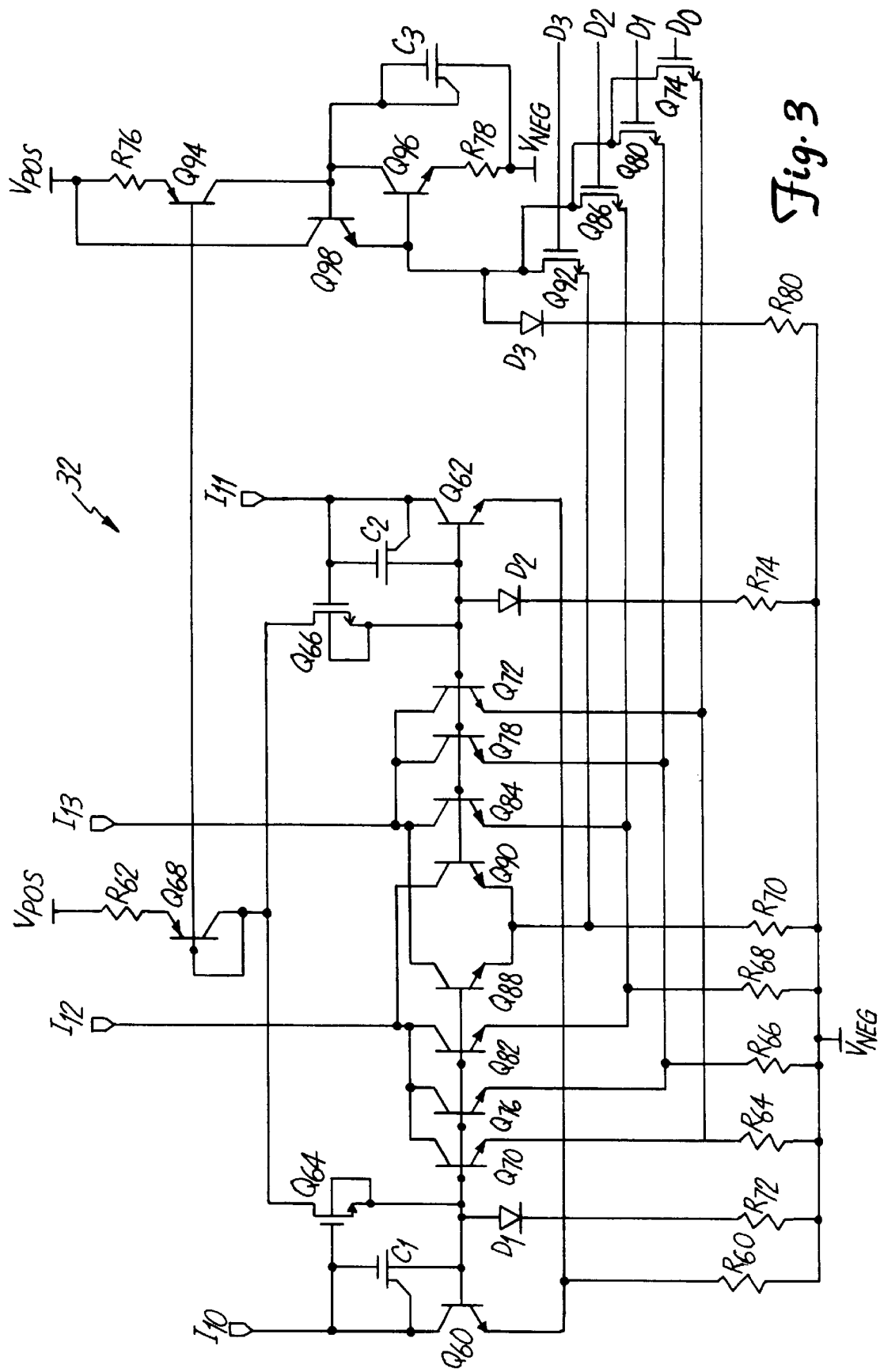
FIG. 3 is a second embodiment of a multiplying digital-to-analog converter of the present invention.

FIG. 3 shows a second embodiment of the present invention wherein the digitally controlled gates have been shifted to form a parallel connection to the differential pairs of output transistors. Multiplying DAC 32 of FIG. 3 receives two input currents $I_{10}$ and $I_{11}$ and produces two output currents $I_{12}$ and $I_{13}$. Two input transistors, $Q_{60}$ and $Q_{62}$, have their collectors connected to respective input nodes carrying the input currents. The emitters of transistor $Q_{60}$ and $Q_{62}$ are connected together at one terminal of resistor $R_{60}$, which has its second terminal connected to lower power supply $V_{NEG}$. $V_{NEG}$ provides a reference voltage that is lower than an upper power supply $V_{POS}$. The collectors of transistors $Q_{60}$ and $Q_{62}$ are coupled to the gates of field-effect transistors $Q_{64}$ and $Q_{66}$, respectively. The sources of field-effect transistors $Q_{64}$ and $Q_{66}$ are connected to the bases of transistors $Q_{60}$ and $Q_{62}$, respectively. The drains of field-effect transistors $Q_{64}$ and $Q_{66}$ are connected together at a current source formed by PNP transistor $Q_{68}$ and resistor $R_{62}$. Specifically, transistor $Q_{68}$ has its base and collector coupled together at the drains of transistors $Q_{64}$ and $Q_{65}$ and its emitter is connected to resistor $R_{62}$, which is further connected to upper power supply $V_{POS}$.

Input currents $I_{10}$ and $I_{11}$ cause transistors $Q_{64}$ and $Q_{66}$, respectively, to conduct sufficient current to turn on transistors $Q_{60}$ and $Q_{62}$ such that the collector current of transistor $Q_{60}$ is equal to $I_{10}$ and the collector current of transistor $Q_{62}$ is equal to $I_{11}$.

Output currents $I_{12}$ and $I_{13}$ are formed by four differential pairs of transistors. Transistors $Q_{70}$ and $Q_{72}$ form a first differential pair with the collector of transistor $Q_{70}$ connected to the node carrying output current $I_{12}$ and the collector of transistor $Q_{72}$ connected to the node carrying output current $I_{13}$. The base of transistor $Q_{70}$ is connected to the base of transistor $Q_{60}$ and the base of transistor $Q_{72}$ is connected to the base of transistor $Q_{62}$. The emitters of transistors $Q_{70}$ and $Q_{72}$ are connected to one terminal of resistor $R_{64}$, which has its second terminal connected to lower reference voltage $V_{NEG}$. The emitters of transistors $Q_{70}$ and $Q_{72}$ are also connected to the source of field-effect transistor $Q_{74}$, which, when active, provides a voltage to the emitters of transistors $Q_{70}$ and $Q_{72}$ that causes transistors $Q_{70}$ and $Q_{72}$ to turn off. When transistor $Q_{74}$ is inactive, it appears as an open circuit to the emitters of transistors $Q_{70}$ and $Q_{72}$ and as such does not affect the emitter currents of transistors $Q_{70}$ and $Q_{72}$.

When transistor $Q_{74}$ presents an open circuit to the emitters of transistors $Q_{70}$ and $Q_{72}$, the collector currents of transistors $Q_{70}$ and $Q_{72}$ are proportional to the collector currents of transistors $Q_{60}$ and $Q_{62}$, respectively. The proportionality constant for the collector currents is primarily determined by the ratio of input bias resistor $R_{60}$ to resistor $R_{64}$. However, for improved accuracy, the width-to-length ratios of transistor $Q_{70}$ to transistor $Q_{60}$ and transistor $Q_{72}$ to transistor $Q_{62}$ should match the ratio of resistor $R_{60}$ to resistor $R_{64}$. In preferred embodiments, resistor $R_{64}$ is sixteen times as large as resistor $R_{60}$ such that the collector current of transistor $Q_{70}$ is $\frac{1}{16}$ the collector current of transistor $Q_{60}$ and the collector current of transistor $Q_{72}$ is $\frac{1}{16}$ the collector current of transistor $Q_{62}$. Thus, in a preferred embodiment, when transistor $Q_{74}$ presents an open circuit to the emitters of transistors $Q_{70}$ and $Q_{72}$, the collector currents of transistors $Q_{70}$ and $Q_{72}$ are $\frac{1}{16}$ the current of input currents $I_{10}$ and $I_{11}$, respectively. Moreover, the difference between the collector currents of transistors $Q_{70}$ and $Q_{72}$ is $\frac{1}{16}$ the difference between the input currents, $I_{10}$ and $I_{11}$.

Transistors $Q_{76}$ and $Q_{78}$ form a second differential pair, with the base of transistor $Q_{76}$ connected to the base of transistor $Q_{60}$ and the base of transistor $Q_{78}$ connected to the base of transistor $Q_{62}$. The emitters of transistors $Q_{76}$ and $Q_{78}$ are connected together at resistor $R_{66}$ and the source of field-effect transistor $Q_{80}$. The collector of transistor $Q_{76}$ is connected to the node carrying output current $I_{12}$ and the collector of transistor $Q_{78}$ is connected to the node carrying output current $I_{13}$. Transistor $Q_{80}$ controls transistors $Q_{76}$ and $Q_{78}$ in the same manner that field-effect transistor $Q_{74}$ controls transistors $Q_{70}$ and $Q_{72}$. In preferred embodiments, resistor $R_{66}$ is chosen so that it is eight times as large as resistor $R_{60}$. This causes the collector currents of transistors $Q_{76}$ and $Q_{78}$ to be $\frac{1}{8}$ the collector current of transistors $Q_{60}$ and $Q_{62}$, respectively. Thus, in this configuration, transistor $Q_{76}$ reflects $\frac{1}{8}$ of input current $I_{10}$ and transistor $Q_{78}$ reflects $\frac{1}{8}$ of input current $I_{11}$. In addition, the difference between the collector currents of transistors $Q_{76}$ and $Q_{78}$ is equal to $\frac{1}{8}(I_{10}-I_{11})$.

Transistors $Q_{82}$ and $Q_{84}$ form a third differential pair, with the base of transistor $Q_{82}$ connected to the base of transistor $Q_{60}$ and the base of transistor $Q_{84}$ connected to the base of transistor $Q_{62}$. The emitters of transistors $Q_{82}$ and $Q_{84}$ are connected together at resistor $R_{68}$ and the source of field-effect transistor $Q_{86}$. The collector of transistor $Q_{82}$ is connected to the node carrying output current $I_{12}$ and the collector of transistor $Q_{84}$ is connected to the node carrying output current $I_{13}$. Transistor $Q_{86}$ controls transistors $Q_{82}$ and $Q_{84}$ in the same manner that field-effect transistor $Q_{74}$ controls transistors $Q_{70}$ and $Q_{72}$. In preferred embodiments, resistor $R_{68}$ is chosen so that it is four times as large as resistor $R_{60}$. This causes the collector currents of transistors $Q_{82}$ and $Q_{84}$ to be $\frac{1}{4}$ the collector current of transistors $Q_{60}$ and $Q_{62}$, respectively. Thus, in this configuration, transistor $Q_{82}$ reflects $\frac{1}{4}$ of input current $I_{10}$ and transistor $Q_{84}$ reflects $\frac{1}{4}$ of input current $I_{11}$. In addition, the difference between the collector currents of transistors $Q_{82}$ and $Q_{84}$ is equal to $\frac{1}{4}(I_{10}-I_{11})$.

Transistors $Q_{88}$ and $Q_{90}$ form a last differential pair, with their emitters connected together at resistor $R_{70}$ and the source of field-effect transistor $Q_{92}$. The second end of resistor $R_{70}$ is connected to $V_{NEG}$. The base of transistor $Q_{88}$ is connected to the base of transistor $Q_{60}$, but the collector of transistor $Q_{88}$ is cross-connected to the node carrying output current $I_{13}$. Similarly, the base of transistor $Q_{90}$ is connected to the base of transistor $Q_{62}$, but the collector of transistor $Q_{90}$ is cross-connected to the node carrying output current $I_{12}$. Transistor $Q_{92}$ controls transistors $Q_{88}$ and $Q_{90}$ in the same manner that field-effect transistor $Q_{74}$ controls transistors $Q_{70}$ and $Q_{72}$. In preferred embodiments, resistor $R_{70}$ is chosen so that it is twice as large as resistor $R_{60}$. This causes the collector currents of transistors $Q_{88}$ and $Q_{90}$ to be $\frac{1}{2}$ the collector current of transistors $Q_{60}$ and $Q_{62}$, respectively. Thus, in this configuration, transistor $Q_{88}$ reflects $\frac{1}{2}$ of input current $I_{10}$ and transistor $Q_{90}$ reflects $\frac{1}{2}$ of input current $I_{11}$. In addition, the difference between the collector currents of transistors $Q_{88}$ and $Q_{90}$ is equal to $\frac{1}{2}(I_{10}-I_{11})$. Because of the cross-connections between the collectors of transistors $Q_{88}$ and $Q_{90}$ and the output nodes carrying $I_{13}$ and $I_{12}$, respectively, this results in a gain contribution of $-\frac{1}{2}$ when field-effect transistor $Q_{92}$ is inactive.

The addition of transistors $Q_{64}$ and $Q_{66}$ in FIG. 3 provides a benefit over the embodiment of FIG. 2. Specifically, transistors $Q_{64}$ and $Q_{66}$ eliminate input current loss due to the input signals at the bases of input transistors $Q_{60}$ and $Q_{62}$ and output transistors $Q_{70}$, $Q_{72}$, $Q_{76}$, $Q_{78}$, $Q_{82}$, $Q_{84}$, $Q_{88}$, and $Q_{90}$. This improves performance because the amount of base current drawn through these transistors is dependent on the particular beta or current gain of each transistor, and manufacturing variations can cause the transistors to have unequal betas. Such variations can cause inconsistent gains between nominally identical multiplying digital-to-analog converters. They can also produce non-linearities in the gain transfer curve within a DAC.

To keep transistors $Q_{64}$ and $Q_{66}$ in an active, and predictable state of operation, bias circuits are connected to the sources of each transistor. Specifically, at the source of transistor $Q_{64}$, diode $D_{11}$ and resistor $R_{72}$ form a first bias circuit. This bias circuit allows transistor $Q_{64}$ to conduct a larger current than simply the base currents of transistors $Q_{60}$, $Q_{70}$, $Q_{76}$, $Q_{82}$, and $Q_{88}$. The anode of diode $D_{11}$ is connected to the source of transistor $Q_{64}$ and the cathode of diode $D_4$ is connected to resistor $R_{72}$, The second terminal of resistor $R_{72}$ is connected to lower power supply $V_{NEG}$. Similarly, diode $D_{22}$ and resistor $R_{74}$ form a bias circuit at the source of transistor $Q_{66}$. The anode of $D_{22}$ is connected to the source of transistor $Q_{66}$ and the cathode of $D_{22}$ is connected to resistor $R_{74}$. The second terminal of resistor $R_{74}$ is connected to lower power supply voltage $V_{NEG}$. In preferred embodiments, resistors $R_{72}$ and $R_{74}$ are each equal to resistor $R_{60}$, such that both the current through resistor $R_{72}$ and the current through resistor $R_{74}$ are individually equal to the sum of input currents $I_{10}$ and $I_{11}$.

Since the base currents of transistors $Q_{60}$, $Q_{62}$, $Q_{70}$, $Q_{72}$, $Q_{76}$, $Q_{78}$, $Q_{82}$, $Q_{84}$, $Q_{88}$, and $Q_{90}$ are quite small, the current through the sources of transistors $Q_{64}$ and $Q_{66}$ is approximately equal to the currents through resistor $R_{72}$ and resistor $R_{74}$, respectively. Thus, both transistor $Q_{64}$ and $Q_{66}$ carry a current equal to the sum of the input currents $I_{10}$ and $I_{11}$. This causes the current source formed by transistors $Q_{68}$ and resistor $R_{62}$ to produce a current equal to twice the sum of input currents $I_{10}$ and $I_{11}$.

Connected between the gate and source of transistor $Q_{64}$ is capacitor $C_1$. Capacitor $C_1$ has a body connection that is also connected to the gate of transistor $Q_{64}$. Capacitor $C_1$ is added to the circuit to provide compensation for a parasitic pole in the frequency response introduced by the addition of transistor $Q_{64}$. Similarly, capacitor $C_2$ is connected between the gate and source of transistor $Q_{66}$ with a body connection to the gate of transistor $Q_{66}$, to compensate for the pole introduced by transistor $Q_{66}$.

As discussed above, field-effect transistors $Q_{74}$, $Q_{80}$, $Q_{86}$, and $Q_{92}$ control the current flow through the various differential pairs of output transistors. In preferred embodiments, the gates of transistors $Q_{74}$, $Q_{80}$, $Q_{86}$, and $Q_{92}$ are connected to separate digital inputs, which represent bits of a binary value. In particular, the gate of transistor $Q_{74}$ receives the least significant bit of the binary value, the gate of transistor $Q_{80}$ receives the second least significant bit, the gate of transistor $Q_{86}$ receives the third least significant bit, and the gate of transistor $Q_{92}$ receives the most significant bit. In this preferred configuration, a voltage at the respective gate equal to $V_{NEG}$ represents a bit value of "1" and a voltage greater than $V_{NEG}$ at the respective gate represents a bit value of "0". Thus, for a bit value of "1" the voltage at the respective gate is equal to $V_{NEG}$ and the respective field-effect transistor, for instance $Q_{74}$, is inactive and presents an open circuit to the emitters of the respective differential pair. In this state, the respective differential pair conducts a current. For a bit value of "0", a voltage greater than $V_{NEG}$ appears at the gate of the respective field-effect transistor and the field-effect transistor is active. This raises the voltage at the emitters of the respective differential pair causing the differential pair to become inactive.

Based on the gains attributable to each differential pair, as discussed above, field-effect transistors $Q_{74}$, $Q_{80}$, $Q_{86}$ and $Q_{92}$ are able to discretely control gain contributions of $1/16$, $1/8$, $1/4$, and $-1/2$, respectively. Thus, multiplying DAC 32 can implement discrete gains between $-8/16$ and $7/16$, with each gain separated by $1/16$, and with the numerator of the gain represented by the decimal equivalent of the binary value received at the gates of field-effect transistors $Q_{74}$, $Q_{80}$, $Q_{86}$, and $Q_{92}$.

For example, a value of 1001, representing $-7$ decimal, creates a gain of $-7/16$ by deactivating field-effect transistors $Q_{92}$ and $Q_{74}$, and activating transistors $Q_{80}$ and $Q_{86}$. The activation of transistors $Q_{80}$ and $Q_{86}$ causes the voltage at the drains of those transistors to appear at their sources, and thus raises the voltage at the emitters of transistor $Q_{76}$, $Q_{78}$, $Q_{82}$, and $Q_{84}$. This causes transistors $Q_{76}$, $Q_{78}$, $Q_{82}$, $Q_{84}$ to become inactive. The deactivation of field-effect transistors $Q_{74}$ and $Q_{92}$ causes those transistors to appear as open circuits at the emitters of transistors $Q_{70}$, $Q_{72}$, $Q_{88}$, and $Q_{90}$. Thus, the differential pair formed by transistors $Q_{70}$ and $Q_{72}$ is active and contributes a gain of $+1/16$; and the differential pair formed by transistors $Q_{88}$ and $Q_{90}$ is active and contributes a gain of $-1/2$. Thus, the total gain resulting from a binary value of 1001 is $(1/16 - 1/2)$ or $-7/16$.

The voltage at the drains of $Q_{74}$, $Q_{80}$, $Q_{86}$, and $Q_{92}$, which is used to turn off selected differential pairs, is created using a voltage source driven by a series of current mirrors. As discussed above, transistor $Q_{68}$ and resistor $R_{62}$ act as a current source providing twice the sum of input currents $I_{10}$ and $I_{11}$. The base of transistor $Q_{68}$ is connected to the base of transistor $Q_{94}$, which is also a PNP transistor. The emitter of transistor $Q_{94}$ is connected to resistor $R_{76}$ which is further connected to upper power supply $V_{POS}$. In preferred embodiments, the resistance of resistor $R_{76}$ is twice as large as the resistance of resistor $R_{62}$ and transistor $Q_{94}$ has half the saturation current of transistor $Q_{68}$. In this configuration, the collector current of transistor $Q_{94}$ is one-half the collector current of transistor $Q_{68}$.

The collector of transistor $Q_{94}$ is connected to the collector of NPN transistor $Q_{96}$ and the base of NPN transistor $Q_{98}$. The emitter of transistor $Q_{96}$ is connected to resistor $R_{78}$ which has a second terminal connected to lower power supply voltage $V_{NEG}$. The emitter of transistor $Q_{98}$ is connected to the base of transistor $Q_{96}$ forming a feedback loop. The collector of transistor $Q_{98}$ is connected to upper power supply $V_{POS}$.

In operation, the current of transistor $Q_{94}$ causes transistors $Q_{98}$ and $Q_{96}$ to become active such that nearly all of the collector current of transistor $Q_{94}$ is carried through the collector of transistor $Q_{96}$. Since the collector current of transistor $Q_{96}$ is approximately equal to its emitter current, resistor $R_{78}$ carries a current equal to the collector current of transistor $Q_{94}$. Since the collector current of transistor $Q_{94}$ is $1/2$ the collector current of transistor $Q_{68}$, and the collector current of transistor $Q_{68}$ is equal to twice the sum of input currents $I_{10}$ and $I_{11}$, the collector current of transistor $Q_{94}$ is equal to the sum of the input currents $I_{10}$ and $I_{11}$. Thus, resistor $R_{78}$ carries a current equal to the sum of the input currents $I_{10}$ and $I_{11}$. In preferred embodiments, resistor $R_{78}$ is equal to resistor $R_{60}$ so that the voltage developed across resistor $R_{78}$ is equal to the voltage developed across resistor $R_{60}$, since both resistors carry a current equal to the sum of the input currents $I_{10}$ and $I_{11}$.

Thus, the voltage at the base of transistor $Q_{96}$ is equal to the voltage across resistor $R_{60}$ plus the diode voltage drop between the base and emitter of transistor $Q_{96}$. This voltage is approximately equal to the voltage at the bases of the differential pairs of transistors.

The base of transistor $Q_{96}$ is connected to the drains of field-effect transistors $Q_{74}$, $Q_{80}$, $Q_{86}$, and $Q_{92}$. When the gate of a field effect transistor is high, its drain-to-source impedance is low and the voltage at the base of transistor $Q_{96}$ appears at the source of the active field-effect transistor and at the emitters of the differential output pair coupled to the active field-effect transistor. Since the voltage at the base of transistor $Q_{96}$ is approximately equal to the voltage at the bases of the differential pairs, the base-emitter voltages of the transistors in the differential pair drops to zero. Thus, a differential pair of transistors becomes inactive when its associated field-effect transistor is active.

Driving the voltage source by using a current mirror that is dependent upon the input current signals allows the voltage at the sources of field-effect transistors $Q_{74}$, $Q_{80}$, $Q_{86}$, and $Q_{92}$ to vary with the common mode of the input signals. This self-biasing eliminates errors that might otherwise occur if a separate bias voltage were used to control the differential output pairs of transistors.

A capacitor $C_3$ is connected between the collector of transistor $Q_{96}$ and lower power supply $V_{NEG}$. Capacitor $C_3$ compensates the frequency response of the closed loop system created by transistors $Q_{98}$, and $Q_{96}$, and resistor $R_{78}$.

To maintain transistor $Q_{98}$ in an active region of operation, a bias circuit is connected between the emitter of transistor of $Q_{98}$ and lower power supply $V_{NEG}$. The bias circuit includes diode $D_{33}$ and resistor $R_{80}$ with the anode of diode $D_{33}$ connected to the emitter of transistor $Q_{98}$, the cathode of diode $D_{33}$ connected to one terminal resistor $R_{80}$, and the second terminal of resistor $R_{80}$ connected to lower power supply $V_{NEG}$. In preferred embodiments, resistor $R_{80}$ is equal to resistor $R_{64}$.

The embodiment of FIG. 3 has a slower response time and settling time to changes in the binary inputs than the embodiment of FIG. 2. However, the embodiment of FIG. 3 has a slightly smaller headroom voltage than the embodiment of FIG. 2, because the field-effect transistors are not in series with the differential pairs in the embodiment of FIG. 3.

Although the embodiments shown in FIG. 2 and FIG. 3 disclose two different mechanisms for creating a current mirror between the input transistors and the differential pair of output transistors, those skilled in the art will recognize that other techniques for creating current mirrors may be substituted for those shown in FIGS. 2 and 3 without departing from the scope of the present invention.

Although the present invention has been described with reference to preferred embodiments, workers skilled in the art will recognize that changes may be made in form and detail without departing from the spirit and scope of the invention.

What is claimed is:

1. A multiplying digital-to-analog converter for producing first and second output currents that have a magnitude difference equal to a gain value multiplied by the magnitude difference between first and second input currents, the converter comprising:

first and second input nodes for carrying the first and second input currents, respectively;

first and second output nodes for carrying the first and second output currents, respectively;

a first input transistor having a first terminal coupled to the first input node, a second terminal having a voltage that increases with increases in the first input current, and a third terminal for carrying a first input bias current;

a second input transistor having a first terminal coupled to the second input node, a second terminal having a voltage that increases with increases in the second input current, and a third terminal for carrying a second input bias current;

at least one input bias circuit path connected between a reference voltage and the third terminals of the first and second input transistors, the at least one input bias circuit path having a net impedance greater than zero;

a first output transistor having a first terminal coupled to the first output node, a second terminal coupled to the second terminal of the first input transistor, and a third terminal for carrying a first output bias current;

a second output transistor having a first terminal coupled to the second output node, a second terminal coupled to the second terminal of the second input transistor, and a third terminal for carrying a second output bias current; and a first output bias circuit between a reference voltage and the third terminals of the first and second output transistors, the first output bias circuit connected to a gate means capable of being in at least a first and second state, the first output bias circuit having a first output bias impedance and carrying a net current equal to the sum of the first and second output bias currents when the gate means is in the first state, the first and second output bias currents having zero magnitude when the gate means is in the second state.

2. The converter of claim 1 further comprising:

a third output transistor having a first terminal coupled to the first output node, a second terminal coupled to the second terminal of the first input transistor, and a third terminal for carrying a third output bias current;

a fourth output transistor having a first terminal coupled to the second output node, a second terminal coupled to the second terminal of the second input transistor, and a third terminal for carrying a fourth output bias current; and a second output bias circuit between a reference voltage and the third terminals of the third and fourth output transistors, the second output bias circuit connected to a second gate means capable of being in at least a first and second state, the second output bias circuit having a second output bias impedance and carrying a net current equal to the sum of the third and fourth output bias currents when the second gate means is in the first state, the third and fourth output bias currents having zero magnitude when the second gate means is in the second state.

3. The converter of claim 1 further comprising:

a fifth output transistor having a first terminal coupled to the second output node, a second terminal coupled to the second terminal of the first input transistor, and a third terminal for carrying a fifth output bias current;

a sixth output transistor having a first terminal coupled to the first output node, a second terminal coupled to the second terminal of the second input transistor, and a third terminal for carrying a sixth output bias current; and a third output bias circuit between a reference voltage and the third terminals of the fifth and sixth output transistors, the third output bias circuit connected to a third gate means capable of being in at least a first and second state, the third output bias circuit having a third output bias impedance and carrying a net current equal to the sum of the fifth and sixth output bias currents when the third gate means is in the first state, the fifth and sixth output bias currents having zero magnitude when the third gate means is in the second state.

4. The converter of claim 1 wherein the ratio of the impedance of the at least one input bias circuit path to the first output bias impedance is equal to the ratio of the sum of the currents at the first terminals of the first and second output transistors over the sum of the currents at the first terminals of the first and second input transistors.

5. The converter of claim 2 wherein the ratio of the impedance of the at least one input bias circuit path to the first output bias impedance is equal to the ratio of the sum of the currents at the first terminals of the first and second output transistors over the sum of the currents at the first terminals of the first and second input transistors and the ratio of the impedance of the at least one input bias circuit path to the second output bias impedance is equal to the ratio of the sum of the currents at the first terminals of the third and fourth output transistors over the sum of the currents at the first terminals of the first and second input transistors.

6. The converter of claim 5 wherein the ratio of the first output impedance to the second output impedance is equal to two.

7. The converter of claim 6 wherein the first and second gate means are controlled by first and second gate inputs, the first gate input receiving a signal representing the least significant binary digit in a binary value and the second gate input receiving a signal represent the next to least significant binary digit in the binary value.

8. The converter of claim 3 wherein the first and third gate means are controlled by first and third gate inputs, respectively, the third gate input receiving a signal representing the most significant binary digit in a binary value, the most significant binary digit capable of representing a change in sign in the binary value.

9. The converter of claim 1 wherein the gate means is connected in series with a first output impedance in the first output bias circuit.

10. The converter of claim 1 wherein the gate means is connected between the third terminals of the first and second output transistors and a voltage source.

11. The converter of claim 10 wherein when the gate means is in the second state, the voltage source raises the voltage at the third terminals of the first and second output transistors to reduce the magnitude of the first and second output bias currents to zero.

12. A multiplying digital to analog converter for producing first and second output currents that have a magnitude difference equal to a gain value multiplied by the magnitude difference between first and second input currents, the converter comprising:

first and second input nodes for carrying the first and second input currents, respectively;

first and second output nodes for carrying the first and second output currents, respectively;

a first input transistor having a first terminal coupled to the first input node, a second terminal having a voltage that increases with increases in the first input current, and a third terminal for carrying a first input bias current;

a second input transistor having a first terminal coupled to the second input node, a second terminal having a voltage that increases with increases in the second input current, and a third terminal for carrying a second input bias current;

a first output transistor having a first terminal coupled to the first output node, a second terminal coupled to the second terminal of the first input transistor, and a third terminal for carrying a first output bias current;

a second output transistor having a first terminal coupled to the second output node, a second terminal coupled to the second terminal of the second input transistor, and a third terminal for carrying a second output bias current; and a first output bias circuit between a reference voltage and the third terminals of the first and second output transistors, the first output bias circuit including a gate transistor capable of receiving a gate input signal, the gate transistor being the only element in the first output bias circuit that is capable of receiving to a signal other than the first and second output bias currents and the reference voltage.

13. The converter of claim 12 wherein the first output bias circuit comprises:

a resistor having first and second terminals, the first terminal connected at the third terminals of the first and second output transistors; and the gate transistor, having three terminals, a first terminal connected at the resistor's second terminal, a second terminal connected to the reference voltage, and a third terminal connected to a node that is capable of carrying the gate input signal.

14. The converter of claim 13 further comprising:

an input bias circuit connected between a reference voltage and the third terminals of the first and second input transistors, the input bias circuit creating a voltage that changes as the sum of the first and second input bias currents changes.

15. The converter of claim 14 wherein the input bias circuit creates an impedance between the reference voltage and the third terminals of the first and second input transistors, the ratio of the impedance of the input bias circuit to the impedance of the first output bias circuit equal to the inverse of the ratio of the sum of the first and second input bias currents to the sum of the first and second output bias currents.

16. A multiplying digital to analog converter for producing first and second output currents that have a magnitude difference equal to a gain value multiplied by the magnitude difference between first and second input currents, the converter comprising:

first and second input nodes for carrying the first and second input currents, respectively;

first and second output nodes for carrying the first and second output currents, respectively;

a first current mirror, having first, second, third, and fourth mirror connection points, the first mirror connection point coupled to the first input node, the second mirror connection point coupled to the first output node, the third mirror connection point providing an input bias node, and the fourth mirror connection point providing an output bias node, the first current mirror comprising a first common voltage point having a first common voltage, the first current mirror capable of providing an output current at the second connection point that is a fraction of the current received at the first connection point;

a second current mirror, having fifth, sixth, seventh and eighth mirror connection points, the fifth mirror connection point coupled to the second input node, the sixth mirror connection point coupled to the second output node, the seventh mirror connection point coupled to the input bias node, and the eighth mirror connection point coupled to the output bias node, the second current mirror comprising a second common voltage point having a second common voltage, the second current mirror capable of providing an output current at the sixth connection point that is a fraction of the current received at the fifth connection point;

an output bias circuit connected between the output bias node and a reference voltage;

a gate having a first gate connection coupled to the output bias node, a second gate connection coupled to a gate input node, and a third gate connection coupled to a tracking voltage node, the tracking voltage node having a tracking voltage that tracks the average of the first common voltage and the second common voltage, the gate providing a low impedance path between the tracking voltage node and the output bias node when the gate input node is at a first voltage, the low impedance path causing the currents provided to the second and sixth mirror connection points by the first and second current mirrors, respectively, to diminish to zero magnitude.

17. The converter of claim 16 wherein:

the first current mirror further comprises a first loop transistor having a first loop connection point coupled to the first mirror connection point, a second loop connection point coupled to the first common voltage point, and a third loop connection point;

the second current mirror further comprises a second loop transistor having a fourth loop connection point coupled to the fifth mirror connection point, a fifth loop connection point coupled to the second common voltage point, and a sixth loop connection point coupled to the third loop connection point; and the converter further comprises a loop current source coupled to the third loop connection point.

18. The converter of claim 17 further comprising:

a tracking current mirror, coupled to the loop current source, for producing a tracking mirror current in proportion to the current of the loop current source; and a voltage source, coupled to the tracking current mirror and the tracking voltage node, the voltage source creating the tracking voltage based on the tracking mirror current.

19. The converter of claim 18 further comprising:

a first bypass circuit, connected between the first common voltage node and the reference voltage, the first bypass circuit having a first bypass impedance; and a second bypass circuit, connected between the second common voltage node and the reference voltage, the second bypass circuit having a second bypass impedance.

20. The converter of claim 19 wherein:

the first and second bypass impedances are such that the first and second bypass circuits each conduct currents equal to the current leaving the input bias node;

the tracking current mirror produces a tracking current that is one half the current produced by the loop current source; and the voltage source conducts nearly the entire tracking current through a circuit to produce a portion of the tracking voltage.

* * * * *